(12) United States Patent
Doesburg et al.

(10) Patent No.: US 11,046,614 B2
(45) Date of Patent: Jun. 29, 2021

(54) CERAMIC MATERIAL FOR HIGH TEMPERATURE SERVICE

(71) Applicant: OERLIKON METCO (US) INC., Westbury, NY (US)

(72) Inventors: Jacobus Doesburg, Westbury, NY (US); Mitchell Dorfman, Westbury, NY (US); Matthew Gold, Westbury, NY (US); Liangde Xie, Mason, OH (US)

(73) Assignee: OERLIKON METCO (US) INC., Westbury, NY (US)

( * ) Notice: Subject to any disclaimer, the term of this patent is extended or adjusted under 35 U.S.C. 154(b) by 405 days.

(21) Appl. No.: 15/836,369

(22) Filed: Dec. 8, 2017

(65) Prior Publication Data

US 2018/0099909 A1 Apr. 12, 2018

Related U.S. Application Data

(63) Continuation of application No. 13/913,101, filed on Jun. 7, 2013, now Pat. No. 9,975,812, which is a (Continued)

(51) Int. Cl.
*C04B 35/482* (2006.01)
*C04B 35/486* (2006.01)
(Continued)

(52) U.S. Cl.
CPC .......... *C04B 35/482* (2013.01); *C04B 35/486* (2013.01); *C04B 35/62665* (2013.01); (Continued)

(58) Field of Classification Search
CPC ................ C04B 35/482; C04B 35/486; C04B 35/62665; C04B 2235/3224; C04B 2235/3225; C04B 2235/3227; C04B 2235/3246; C04B 2235/72; C23C 4/11; C23C 14/083; C23C 30/00; C09D 1/00; (Continued)

(56) References Cited

U.S. PATENT DOCUMENTS 4,360,598 A 11/1982 Otagiri et al.
4,377,371 A 3/1983 Wisander
(Continued)

FOREIGN PATENT DOCUMENTS

CA 2669781 12/2002
EP 0 707 091 4/1996
(Continued)

OTHER PUBLICATIONS

Machine English translation of JP2002037665 provided by the espacenet website, internet retrieval date of Mar. 16, 2020. (Year: 2002).*

(Continued)

*Primary Examiner* — Jonathan C Langman
(74) *Attorney, Agent, or Firm* — Greenblum & Bernstein, P.L.C.

(57) ABSTRACT

A high purity yttria or ytterbia stabilized zirconia powder wherein a purity of the zirconia is at least 99.5 weight percent purity and with a maximum amount of specified oxide impurities.

20 Claims, 10 Drawing Sheets

Related U.S. Application Data continuation of application No. 11/790,430, filed on Apr. 25, 2007, now Pat. No. 8,603,930, which is a continuation-in-part of application No. 11/520,043, filed on Sep. 13, 2006, now Pat. No. 7,723,249.

(60) Provisional application No. 60/724,268, filed on Oct. 7, 2005.

(51) Int. Cl.

| | | |
|---|---|---|
| C04B 35/626 | (2006.01) | |
| C23C 14/08 | (2006.01) | |
| C23C 30/00 | (2006.01) | |
| F01D 5/28 | (2006.01) | |
| C23C 4/11 | (2016.01) | |
| C09D 1/00 | (2006.01) | |

(52) U.S. Cl.
CPC ............ *C09D 1/00* (2013.01); *C23C 4/11* (2016.01); *C23C 14/083* (2013.01); *C23C 30/00* (2013.01); *F01D 5/288* (2013.01); *C04B 2235/3224* (2013.01); *C04B 2235/3225* (2013.01); *C04B 2235/3227* (2013.01); *C04B 2235/3246* (2013.01); *C04B 2235/72* (2013.01); *Y10T 428/24273* (2015.01); *Y10T 428/24331* (2015.01); *Y10T 428/24471* (2015.01)

(58) Field of Classification Search
CPC ............. F01D 5/288; Y10T 428/24471; Y10T 428/24331; Y10T 428/24273
See application file for complete search history.

(56) References Cited

U.S. PATENT DOCUMENTS

| | | |
|---|---|---|
| 4,430,360 A | 2/1984 | Bill |
| 4,457,948 A | 7/1984 | Ruckle |
| 4,481,237 A | 11/1984 | Bosshart |
| 4,485,151 A | 11/1984 | Stecura |
| 4,503,130 A | 3/1985 | Bosshart |
| 4,519,840 A | 5/1985 | Jackson |
| 4,520,114 A | 5/1985 | David |
| 4,535,033 A | 8/1985 | Stecura |
| 4,565,792 A | 1/1986 | Knapp |
| 4,588,607 A | 5/1986 | Matarese |
| 4,626,476 A | 12/1986 | Londry |
| 4,639,356 A | 1/1987 | O' Tool e et al. |
| 4,788,045 A | 11/1988 | Colombet et al. |
| 4,822,689 A | 4/1989 | Fukubayashi |
| 4,849,142 A | 7/1989 | Panda et al. |
| 4,884,820 A | 12/1989 | Jackson |
| 4,898,368 A | 2/1990 | Schaffer et al. |
| 4,936,745 A | 6/1990 | Vine et al. |
| 5,015,502 A | 5/1991 | Strangman |
| 5,059,095 A | 10/1991 | Kushner |
| 5,073,433 A | 12/1991 | Taylor |
| 5,106,794 A | 4/1992 | Oizumi et al. |
| 5,372,845 A | 12/1994 | Rangeswamy |
| 5,384,200 A | 1/1995 | Giles |
| 5,418,003 A | 5/1995 | Bruce et al. |
| 2,714,563 A | 8/1995 | Pooerman |
| 5,455,119 A | 10/1995 | Taylor |
| 5,520,516 A | 5/1996 | Taylor |
| 5,630,314 A | 5/1997 | Kojima |
| 5,705,231 A | 1/1998 | Nissley et al. |
| 5,743,013 A | 4/1998 | Taylor |
| 5,780,110 A | 7/1998 | Schaeffer et al. |
| 5,780,171 A | 7/1998 | Nissley et al. |
| 5,879,753 A | 3/1999 | Zajchowski |
| 5,981,088 A | 11/1999 | Bruce |
| 5,993,976 A | 11/1999 | Sahoo et al. |
| 6,042,878 A | 3/2000 | Bruce |
| 6,069,103 A | 5/2000 | Kwon |
| 6,102,656 A | 8/2000 | Nissley et al. |
| 6,117,560 A | 9/2000 | Maloney |
| 6,123,997 A | 9/2000 | Schaeffer |
| 6,180,262 B1 | 1/2001 | Freling |
| 6,190,124 B1 | 2/2001 | Freling |
| 6,284,691 B1 | 9/2001 | Bruce |
| 6,352,788 B1 | 3/2002 | Bruce |
| 6,358,002 B1 | 3/2002 | Good et al. |
| 6,432,487 B1 | 8/2002 | Graham |
| 6,503,290 B1 | 1/2003 | Jarosinski |
| 6,703,334 B2 | 3/2004 | Below |
| 6,808,799 B2 | 10/2004 | Darolia |
| 6,812,176 B1 | 11/2004 | Zhu et al. |
| 6,869,550 B2 | 3/2005 | Dorfman et al. |
| 6,887,595 B1 | 5/2005 | Darolia |
| 6,893,994 B2 | 5/2005 | Wallar |
| 6,960,395 B2 | 11/2005 | Spitsberg et al. |
| 7,001,859 B2 | 2/2006 | Zhu et al. |
| 7,186,466 B2 | 3/2007 | Shu et al. |
| 7,723,249 B2 | 5/2010 | Doesburg et al. |
| 7,776,459 B2 | 8/2010 | Schlichting |
| 7,846,561 B2 | 12/2010 | Kulkarni et al. |
| 7,931,836 B2 | 4/2011 | Xie et al. |
| 8,021,762 B2 | 9/2011 | Taylor et al. |
| 8,197,950 B2 | 6/2012 | Taylor |
| 8,394,484 B2 | 3/2013 | Taylor |
| 8,603,930 B2 | 12/2013 | Doesburg |
| 8,728,967 B2 | 5/2014 | Taylor |
| 2002/0094448 A1 | 7/2002 | Rigney et al. |
| 2003/0118873 A1 | 6/2003 | Murphy |
| 2003/0138641 A1* | 7/2003 | Fukudome ............ C04B 35/486 428/446 |
| 2003/0138658 A1 | 7/2003 | Taylor et al. |
| 2004/0033884 A1 | 2/2004 | Wallar |
| 2004/0229031 A1 | 11/2004 | Gell et al. |
| 2005/0170200 A1 | 8/2005 | Nagaraj et al. |
| 2005/0238894 A1 | 10/2005 | Gorman et al. |
| 2005/0249977 A1* | 11/2005 | Hisamatsu ............ C04B 35/481 428/698 |
| 2006/0024527 A1 | 2/2006 | Schlichting |
| 2006/0141283 A1 | 6/2006 | Madhava |
| 2006/0216534 A1 | 9/2006 | Boutwell et al. |
| 2007/0082131 A1 | 4/2007 | Doesburg et al. |
| 2007/0274837 A1 | 11/2007 | Taylor et al. |
| 2008/0160172 A1 | 7/2008 | Taylor et al. |
| 2008/0220209 A1 | 9/2008 | Taylor et al. |
| 2009/0315227 A1 | 12/2009 | Ferrier et al. |
| 2010/0075147 A1 | 3/2010 | Doesburg et al. |
| 2011/0003119 A1 | 1/2011 | Doesburg et al. |
| 2012/0177836 A1 | 7/2012 | Doesburg |

FOREIGN PATENT DOCUMENTS

| | | | |
|---|---|---|---|
| EP | 1 126 044 | 8/2001 | |
| EP | 1 550 645 | 7/2005 | |
| EP | 16 21 647 | 2/2006 | |
| EP | 1 889 949 | 2/2008 | |
| EP | 1 772 441 | 11/2011 | |
| FR | 2 301 482 | 10/1976 | |
| JP | 011 797 25 | 7/1989 | |
| JP | H01-179725 | * 7/1989 | ............ C01G 25/00 |
| JP | 3-223455 | 10/1991 | |
| JP | 0893402 | 4/1996 | |
| JP | 2002037665 | * 2/2002 | ............ C04B 35/48 |
| JP | 2004-515649 | 5/2004 | |
| JP | 2005-002409 | 6/2005 | |
| JP | 2006-045674 | 2/2006 | |
| WO | WO 02/45931 | 6/2002 | |
| WO | 2008/054536 | 5/2008 | |
| WO | WO08/096072 | 8/2008 | |
| WO | WO09/038785 | 3/2009 | |

OTHER PUBLICATIONS

Machine English translation of JPH01-179725 provided by the JPO website, internet retrieval date of Mar. 16, 2020. (Year: 1989).*

(56) References Cited

OTHER PUBLICATIONS

Opposition in German filed in EP 11 772 441 (30 pages) assigned to the Applicant of the instant application along with an English language translation (30 pages) thereof.
Document entitled Evolution of Porosity and Texture in Thermal Barrier Coatings Grown by EB-PVD by S. G. Terry et al. identified in the Opposition as document D2 (12 pages).
Document entitled Influence of impurity content and porosity of plasma-sprayed yttria-stabilized zirconia layers on the sintering behavior by R. Vaβen et al . . . identified in the Opposition as document D3 (6 pages).
Document entitled Plasma sprayed thermal barrier coatings for industrial gas turbines: morphology, processing and properties by H. W. Grunling et al . . . identified in the Opposition as document D4 (10 pages).
Document entitled Relation Between the YSZ Powder Properties and Vacuum Plasma Spray Deposited Layers by M. Zadvydas et al . . . identified in the Opposition as document D9 (4 pages).
Document entitled New Amperit 832 by H.C.Starck & Co. KG . identified in the Opposition as document D10 (2 pages).
Document entitled Amperit, Thermal Spray Powders by H.C. Stark 1999 . identified in the Opposition as document D10a (15 pages).
Document entitled Amperit 832 by H.C. Stark identified in the Opposition as document D10b (5 pages).
Document entitled Profilo di sicurezza by H.C. Stark identified in the Opposition as document D10c (4 pages).
Document entitled Fertigunsauftrag identified in the Opposition as document D11 (1 page).
Document entitled Werksprufzeugnis identified in the Opposition as document D12 (1 page).
Document purporting to be a Purchase Order identified in the Opposition as document D13 (1 page).
Document showing a Chart identified in the Opposition as document D14 (1 page).
Document entitled Porosity identified in the Opposition as document D15 (6 page).
Document entitled Rompp Chemie Lexikon by Prof. Dr. J. Falbe et al. identified in the Opposition as document D15a (5 pages).
Document entitled Die physikalischen und chemischen Grundlagen der Keramik identified in the Opposition as document D15b (2 pages).
Document entitled Thermal Conductivity of dense and posous yttria-stabilized zirconia by K. W. Schlichting et al. identified in the Opposition as document D15c (8 pages).
Document entitled Microstructure and Thermal Conductivity of Layered Thermal Barrier Coatings Processed by Plasma Spray and Physical Vapor Deposition Techniques by K. S. Ravichandran et al. identified in the Opposition as document D15d (12 pages).
Document entitled Sintering Studies of Plasma-Sprayed Zirconia by H. E. Eaton et al. identified in the Opposition as document D16 (10 pages).
Document showing a Chart identified in the Opposition as document D17 (1 page).
Document entitled Zusatzstoffnorm / Auxilliary specification identified in the Opposition as document D18a (6 pages).
Document entitled Zusatzstoffnorm / Filler materials specification identified in the Opposition as document D18b (5 pages).
Amperit Thermal Spray Powder Catalog, H.C. Starck GmbH, published 2005.
Online Catalog "Product Information Amperit 832 Catalog," H.C. Starck GmbH, found at http://www.hcstarck.com/medien/dokumente/document_Produktinfo832.pdf.
Amperit Thermal Spray Powder Catalog, H.C. Starck, published 1995.
R. Vaben, N. Czech, W. Mallener, W. Stamm, D. Stover, "Influence of impurity content and porosity of plasma-sprayed yttria-stabilized zirconia layers on the sintering behavior", pp. 135-140, Apr. 10, 2000, www.eisevier.nl/locate/surfcoat, Germany.
Robert A. Miler, "Thermal Barrier Coatings for Aircraft Engines—History and Directions", NASA Lewis Research Center Mar. 1995, pp. 17-27, Cleveland, OH.
Lou George, "PRAXAIR Introduces New Yttria-Stabilized Zirconia Power", p. 22, www.ptihome.com, Spraytime First Quarter 2003.
Processing of Yttria Partially Stabilized Zirconia Thermal Barrier Coatings Implementing a High-Power Laser Diode by G. Antou et al.
Sherif et al., Emulsion Precipitation of Yttria-Stabilized Zirconia for Plasma Spray Coatings, J. Am. Ceram. Soc., 74 (1991) p. 375-380.
Goedjen et al. Proceedings of the $8^{th}$ National Thermal Spray Conference Sep. 11-15, 1995, Houston TX p. 73-77.
Miller et al. Proceedings of the $7^{th}$ National Spray Conference, Jun. 20-24, 1994, Boston MS p. 49-54.
NASA Technical Memorandum 78976 entitled Effects of Compositional Changes on the Performance of a Thermal Barrier Coating System, Jan. 1979.
VaBen et al., "Influence of Impurity Content and Porosity of Plasma-Sprayed Yttria-Stabilized Zirconia Layers on the Sintering Behaviour," Surface and Coatings Technology 141, 2001, pp. 135-140.
Taylor, et al., "Thermal Fatigue of Plasma Sprayed MgO.Zr02 and Zro2-6/6Y203 Thermal Barrier Coatings," 84th Annual Meeting American Ceramic Soc. Cincinnati, Ohio, May 4, 1982.
I.E. Sumner,et al., "AIAA-80-1193 Dev of Improved-Durability Plasma Sprayed Ceramic Coatings for Gas Turbine Engines," AIAA/SAE/ASME 16th Joint Propulsion Conference Jun. 2, 1980.
G. Johner, et al., "Experimental and Theoretical Aspects of Thick Thermal Barrier Coatings . . . " Thermal Spray: Advances in Coatings Technology, Sep. 14-17, 1987.
Nakahira, et al.,"Advanced Thermal Barrier Coatings Involving Efficient Vertical Micro-Cracks", Int'l Spray Conference & Exposition, Florida, USA, May 28-Jun. 5, 1992, 519-524.
H. W. Grunling, W. Mannmann, Plasma sprayed thermal barrier coatings for industrial gas turbines: morphology, processing and properties, Journal de Physique IV, Colloquium C7, Supplement to Journal de Physique III, (Nov. 1993), vol. 3, pp. 903-912.
G. W. Meetham, High-Temperature Materials, Ullmann's Encyclopedia of Industrial Chemistry, (2001), pp. 1-65.
P. Bowen, Particle Size Distribution Measurement from Millimeters to Nanometers and from Rods to Platelets, Journal of Dispersion Science and Technology, (2002), vol. 23, pp. 631-662.
Thermal spraying Powders Composition, technical supply conditions; and Projection thennique—Poudres-Composition, conditions techniques de livraison; Version allemande, German version EN 1274, Deutsche Norm, (2005), pp. 1-31.
Communication of a notice of opposition dated Aug. 2, 2013 from corresponding EP Application No. 07867118.7, with English translation pp. 59.

* cited by examiner

CERAMIC MATERIAL FOR HIGH TEMPERATURE SERVICE

CROSS REFERENCE TO RELATED APPLICATIONS

The present application is a continuation of parent U.S. application Ser. No. 13/913,101 filed on Jun. 7, 2013, which is a continuation of U.S. application Ser. No. 11/790,430 filed on Apr. 25, 2007, which application is a continuation-in-part of U.S. patent application Ser. No. 11/520,043, filed Sep. 13, 2006, which application claims the benefit under 35 U.S.C. § 119(e) of U.S. Provisional Patent Application No. 60/724,268, filed on Oct. 7, 2005. The entire disclosure of each of the herein listed applications is incorporated herein by reference.

STATEMENT REGARDING SPONSORED RESEARCH OR DEVELOPMENT

Not Applicable.

REFERENCE TO SEQUENCE LISTING

Not Applicable.

BACKGROUND OF THE INVENTION

Field of the Invention

The invention relates to ceramic materials for thermal barriers and abradable coating systems in high temperature and high temperature cycling applications, and more particularly to ultra-pure zirconia materials for use in thermal barrier and abradable coating applications.

Description of Related Art

Superior high-temperature properties are required to improve the performance of heat resistant and corrosion resistant members. These members include, for example gas turbine blades, combustor cans, ducting and nozzle guide vanes in combustion turbines and combined cycle power plants. Turbine blades are driven by hot gasses, and the efficiency of the gas turbine increases with the rise in operational temperature. The demand for continued improvement in efficiency has driven the system designers to specify increasingly higher turbine operating temperatures. Thus, there is a continuing need for materials that can achieve higher operational temperatures.

Thermal barrier coatings are used to insulate components, such as those in a gas turbine, operating at elevated temperatures. Thermal barriers allow increased operating temperature of gas turbines by protecting the coated part (or substrate) from direct exposure to the operating environment. An important consideration in the design of a thermal barrier is that the coating be a ceramic material having a crystalline structure containing beneficial cracks and voids, imparting strain tolerance. If there were no cracks in the coating, the thermal barrier would not function, because the differences in thermal expansion between the metal substrate system and the coating will cause interfacial stresses upon thermal cycling that are greater than the bond strength between them. By the creation of a crack network into the coating, a stress relief mechanism is introduced that allows the coating to survive numerous thermal cycles. Repeating crack networks are typically imparted into the coating on varying space scales by manipulating the thermodynamic and kinetic conditions of the manufacturing method, and different structures known to perform the coating task have been optimized likewise. In addition to this, cracks are also formed during service, so the structure formed upon coating manufacture changes with time, depending on the starting material phases in the manufactured coating and thermal conditions during service.

Another design factor determining coating lifetime is the sintering rate of the coating. When the coating is cycled above half of its absolute melting temperature, the coating begins to sinter causing volume shrinkage. As the coating shrinks, the stress difference between the coating and substrate increases. At a certain amount of shrinkage (which varies depending on the type of structure and thermal conditions during service), the stress difference exceeds the bonding strength of the coating and it becomes detached. Decreasing the sintering rate of the thermal barrier increases the amount of time before the catastrophic shrinkage is experienced, so it can become a major design consideration. For high purity zirconia alloys, the onset of sintering commences at temperatures above 1000° C.

Historically, high temperature thermal barrier coatings have been based on alloys of zirconia. Hafnia may also be employed due to its chemical similarity to zirconia, but is generally cost-prohibitive. Hafnia also is typically present in most zirconia materials in more than trace amounts due to difficulty in separating the two oxides. Zirconia and/or hafnia have the following combination of desirable properties that other known ceramic systems do not possesses for the application. First, zirconia alloys have some of the highest melting points of all ceramics, and this means theoretically some of the highest temperatures for which the onset of sintering occurs. Second, zirconia alloys have one of the lowest thermal conductivities of all ceramics. Third, zirconia has one of the highest coefficients of thermal expansion of all ceramics, so it is most compatible with transition metal alloys during thermal cycling.

Zirconia alone cannot fulfill the coating requirements because it undergoes a phase transformation from tetragonal to monoclinic during thermal cycling. This transformation is presumed to cause a detrimental volume change resulting in large strain differences between the coating and the substrate. When the resulting stresses exceed the bond strength of the coating to the substrate, the coating will detach. For this reason a phase stabilizer is added to the zirconia and/or hafnia, such as yttria, which suppresses the tetragonal to monoclinic phase transformation.

Thermal spray abradable coatings are commonly used in gas turbine applications. Abradable coatings are designed to preferentially abrade when contact is made with a mating part. These coatings have low structural integrity so they are readily abraded when they come into contact with a moving surface with higher structural integrity (such as the blade of a turbine). The coatings are designed so as not to damage the mating surface. In many applications abradable coatings are subject to the same thermal cycling conditions as the thermal barriers described above. Thus, there is a continuing need for materials suitable for abradable coatings that can achieve higher operational temperatures.

Some previous efforts to improve coating life have focused on the coating material and microstructure upon entry into service. However, the heat cycle of in service parts also causes cracks throughout the service life of the part. Thus, the microstructure formed upon coating manufacture changes with time, depending on the starting material phases in the manufactured coating and thermal conditions during service. Because a consistent optimal crack network is not typically maintainable throughout the service life of the part, coating lifetime is ultimately determined by the material selection and its manufacturing process. There remains a need in the art for a coating material, coating material manufacturing method, and coating manufacturing method that address the changes in the coating microstructure during its service lifetime.

SUMMARY

Accordingly, the invention is directed to a ceramic material for use in thermal barriers for high temperature cycling applications and high temperature abradable coatings. The material is an alloy formed predominantly from ultra-pure stabilized zirconia ($ZrO_2$) and/or hafnia ($HfO_2$) alloys that have uncharacteristically high sintering resistance to achieve a high service lifetime. The invention provides a desired coating material so that the changes in the coating microstructure over the in-service lifetime are retarded.

The limits for impurities discovered to decrease sintering rate and therefore increase service lifetime compared with current impurity concentrations when used as a coating and partially stabilized with a rare earth oxide, for example, yttria ($Y_2O_3$) and/or ytterbia ($Yb_2O_5$), are disclosed herein. Oxide impurities are defined as materials which, when combined with each other or with zirconia and/or hafnia, form phases with melting points much lower than that of pure zirconia and/or hafnia.

In one aspect, the invention provides a ceramic material for use in high-temperature thermal barriers or abradable seal coatings. The said material has about 4 to 20 weight percent of a stabilizer of one or more rare earth oxides; and a balance of at least one of zirconia ($ZrO_2$), hafnia ($HfO_2$) and combinations thereof, wherein the zirconia ($ZrO_2$) and/or hafnia ($HfO_2$) is partially stabilized by the stabilizer, and wherein the total amount of impurities is less than or equal to 0.15 weight percent.

In another aspect of the invention a blended ceramic material of one or more ceramic materials is provided. Each of the ceramic materials is for use in high-temperature thermal barriers or abradable seal coatings and is supplied in the form of one of a powder or a slurry of partially stabilized powder. Each of the ceramic materials has about 4 to 20 weight percent of a stabilizer of one or more rare earth oxides and a balance of at least one of zirconia ($ZrO_2$), hafnia ($HfO_2$) and combinations thereof, wherein the zirconia ($ZrO_2$) and/or hafnia ($HfO_2$) is partially stabilized by the stabilizer, and wherein the total amount of impurities of the blended ceramic material is less than or equal to 0.15 weight percent. Additional ceramic materials or placeholder materials may also be included in the blended material.

Conventional approaches to improving coating life-cycles have focused on adding stabilizers to the base ceramic material. The approach of the present invention provides previously unexpected results in sintering data by identifying low-impurity materials. When looking at the sintering data, changing the amount of impurities slightly has a much greater effect on performance compared with changing the amount and types of stabilizers.

In embodiments, there is provided a high purity yttria or ytterbia stabilized zirconia powder wherein a purity of the zirconia is at least 99.5 weight percent purity and a maximum amount of oxide impurities is as follows: less than 0.005 weight percent $SiO_2$; less than 0.015 weight percent $Al_2O_3$; less than 0.002 weight percent $TiO_2$; less than 0.04 weight percent $Fe_2O_3$; less than 0.02 weight percent CaO; less than 0.002 weight percent MgO. The impurities may include less than 0.001 weight percent $Cr_2O_3$ and less than 0.002 weight percent $Na_2O$.

In embodiments, the powder is a thermal sprayable powder.

In embodiments, the zirconia is partially stabilized by the yttria.

In embodiments, the powder has a particle size of from about 5 to 150 microns.

In embodiments, there is provided a method of applying a thermal barrier coating on a substrate, the method comprising thermally spraying the powder of claim 1 onto the substrate so as to form the thermal barrier coating having from about 5 to 250 vertical macro cracks per 25.4 mm length measured along a coating surface and being oriented perpendicular to a surface of the substrate containing said coating.

In embodiments, there is provided a high purity yttria or ytterbia stabilized hafnia powder wherein a purity of the hafnia is at least 99.5 weight percent purity and a maximum amount of oxide impurities is as follows: less than 0.002 weight percent $Na_2O$; less than 0.005 weight percent $SiO_2$; less than 0.015 weight percent $Al_2O_3$; less than 0.002 weight percent $TiO_2$; less than 0.04 weight percent $Fe_2O_3$; less than 0.02 weight percent CaO; less than 0.002 weight percent MgO; and less than 0.001 weight percent $Cr_2O_3$.

In embodiments, the powder is a thermal sprayable powder.

In embodiments, the hafnia is partially stabilized by the yttria.

In embodiments, the powder has a particle size of from about 5 to 150 microns.

In embodiments, there is provided a method of applying a thermal barrier coating on a substrate, the method comprising thermally spraying the powder of claim 6 onto the substrate so as to form the thermal barrier coating having from about 5 to 250 vertical macro cracks per 25.4 mm length measured along a coating surface and being oriented perpendicular to a surface of the substrate containing said coating.

In embodiments, there is provided a high purity yttria stabilized zirconia powder comprising a purity of the zirconia being at least 99.5 weight percent purity, less than about 0.005 weight percent silicon dioxide (silica), less than about 0.015 weight percent aluminum oxide (alumina), less than about 0.02 weight percent calcium oxide, less than about 0.04 weight percent ferric oxide, less than about 0.002 weight percent magnesium oxide, and less than about 0.002 weight percent titanium dioxide.

In embodiments, the powder is a thermal sprayable powder.

In embodiments, the zirconia is partially stabilized by the yttria.

In embodiments, the powder has a particle size of from about 5 to 150 microns.

In embodiments, there is provided a method of applying a thermal barrier coating on a substrate, the method comprising thermally spraying the powder of claim 11 onto the substrate so as to form the thermal barrier coating having from about 5 to 250 vertical macro cracks per 25.4 mm length measured along a coating surface and being oriented perpendicular to a surface of the substrate containing said coating.

In embodiments, there is provided a method of coating a substrate with a thermal barrier coating (TBC) on a substrate via thermal spray, the method comprising spraying a powder coating material comprising a yttria stabilized material comprising zirconia and hafnia, wherein a purity of each of said zirconia and said hafnia being at least 99.5 weight percent and total impurities of said zirconia and said hafnia comprises less than or equal to: about 0.005 weight percent silica, about 0.002 weight percent titania, and about 0.002 weight percent magnesia and forming a TBC coating by depositing the coating material in the form of a collection of frozen droplets or splats, wherein the TBC coating comprises vertical cracks arranged at repeating intervals and extending in a thickness direction of said thermal barrier coating.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The accompanying drawings are included to provide further understanding of the invention and are incorporated in and constitute a part of this specification. The accompanying drawings illustrate embodiments of the invention and together with the description serve to explain the principles of the invention. In the figures.

DETAILED DESCRIPTION OF THE INVENTION

Reference will now be made in detail to the preferred embodiments of the invention, examples of which are illustrated in the accompanying drawings.

Figure 1:
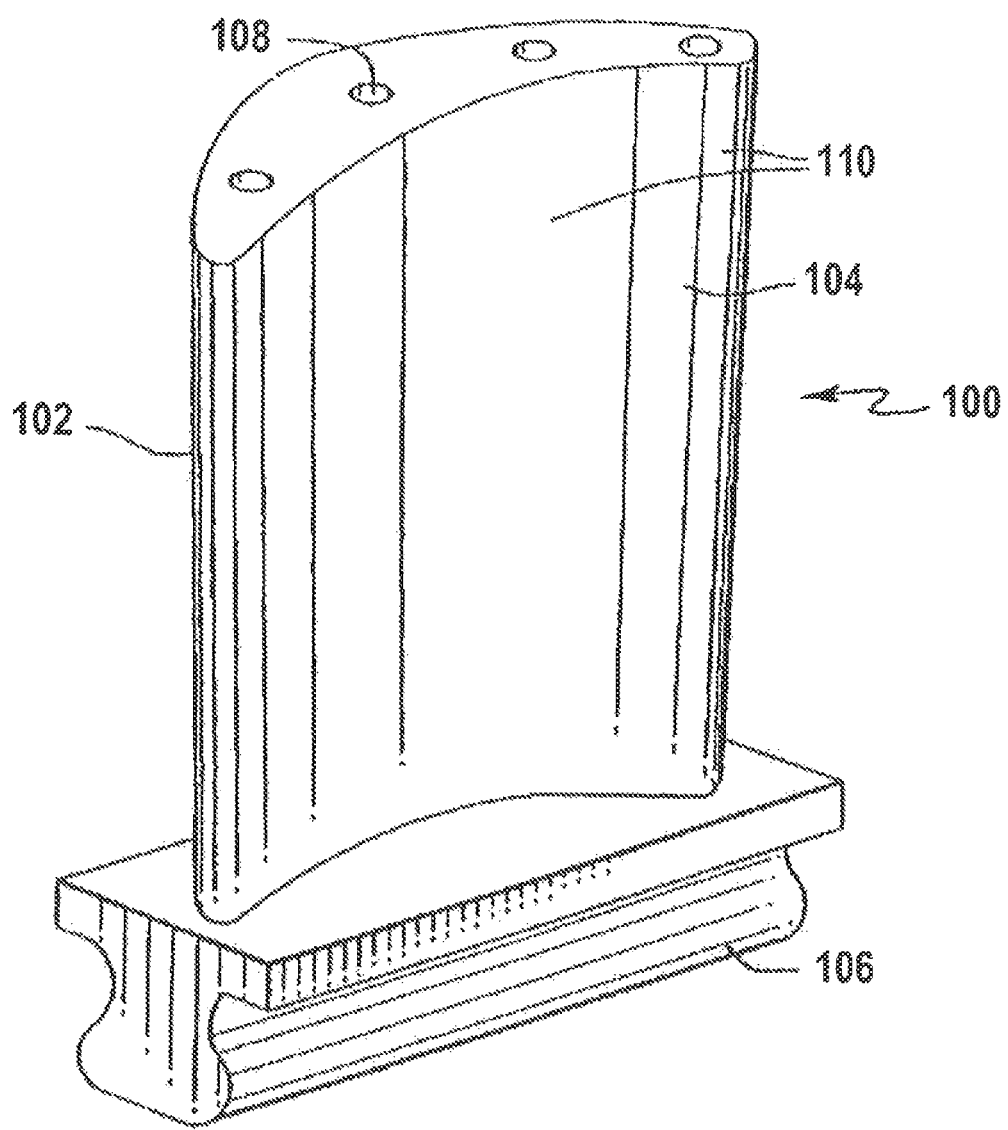
FIG. 1 illustrates a perspective view of a turbine blade coated with a thermal barrier of ceramic material.

In an exemplary use of a material of the invention, FIG. 1 shows one component of a turbine. Turbine blade 100 has a leading edge 102 and an airfoil section 104, against which hot combustion gases are directed during operation of the turbine, and which undergoes severe thermal stresses, oxidation and corrosion. A root end 106 of the blade anchors the blade 100. Venting passages 108 may be included through the blade 100 to allow cooling air to transfer heat from the blade 100. The blade 100 can be made from a high temperature resistant material. The surface of the blade 100 is coated with a thermal barrier coating 110 made of ultra-pure zirconia ($ZrO_2$) and/or hafnia ($HfO_2$) alloys in accordance with the invention. The thermal barrier coating 110 may be applied on, for example, a MCrAlY bonding layer with an alumina scale (not shown) applied between the blade surface and the coating 110. The coating 110 may be applied onto the bond coating surface through a variety of methods known in the art including thermal spray techniques such as powder flame spray and plasma spray and vapor deposition methods such as electron beam physical vapor deposition (EBPVD), high speed physical vapor deposition and low pressure plasma spraying (LPPS).

When applied, the coating 110 contains a crack network that allows it to survive the stress of numerous thermal cycles. As described in the above background section, the crack network is altered to a less desirable state by sintering and temperature cycling during service. Thus the structure formed upon coating manufacture changes with time, the rate depending on the starting material phases. Decreasing the sintering rate increases the amount of time before the closing of microcracks and creation of massive cracks, increasing coating lifetime.

Figure 2:
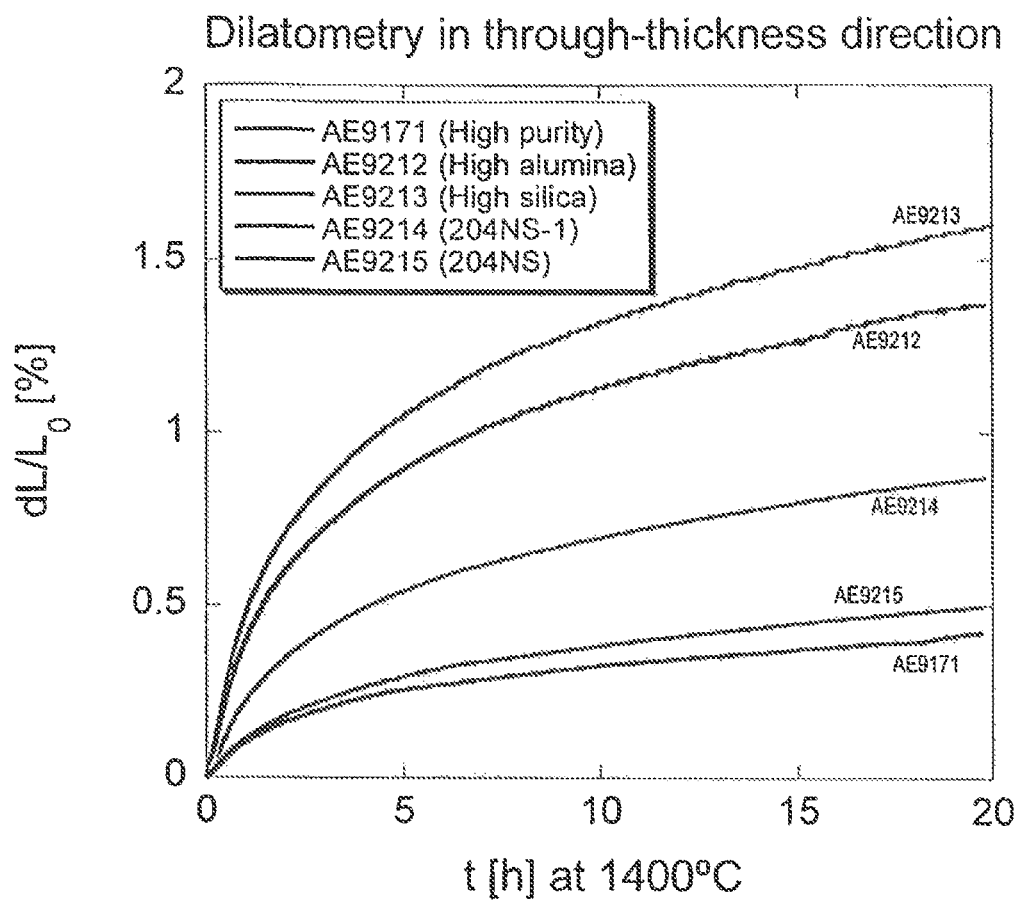
FIG. 2 provides a graph showing the effect of impurities on the sintering rates.

A dominant factor affecting sintering is the presence of specific impurity phases within the structure made up of oxides which when combined with each other or the zirconia alloy result in melting points hundreds of degrees lower than that of the zirconia alloy itself. These impurity oxides increase the sintering rate. FIG. 2 shows the effect of impurity on the sintering rate.

In one embodiment of the present invention, the material contains zirconia ($ZrO_2$) and/or hafnia ($HfO_2$) partially stabilized by a total of 4 to 20 weight percent of one or more rare earth oxides having total impurities less than or equal to 0.15 weight percent, and preferably less than or equal to 0.1 weight percent. For purposes of the invention, rare earth oxides can be defined as any oxide from group IIIB (column 3) of the periodic table of elements, which includes scandia ($Sc_2O_3$), yttria ($Y_2O_3$), lanthanide oxides and actinide oxides.

The material of the present invention contains zirconia ($ZrO_2$) and/or hafnia ($HfO_2$) partially stabilized by a total of 4 to 20 weight percent of a primary stabilizing oxide such as ytterbia and/or yttria, (and optionally additional stabilizers of one or more rare earth oxides) having total impurities less than or equal to 0.15 weight percent, and preferably less than or equal to 0.1 weight percent. For purposes of the present invention, oxide impurities can be defined as materials which when combined with each other or with zirconia form phases with melting points much lower than that of pure zirconia, especially—but not limited to—soda ($Na_2O$), silica ($SiO_2$), and alumina ($Al_2O_3$). Other specific concentration ranges of stabilizers are provided herein and in co-pending and commonly assigned U.S. patent application Ser. No. 11/520,041, entitled "HIGH PURITY CERAMIC ABRADABLE COATINGS," U.S. patent application Ser. No. 11/520,044, entitled "OPTIMIZED HIGH TEMPERATURE THERMAL BARRIER," and U.S. application Ser. No. 11/520,042, entitled "OPTIMIZED HIGH PURITY COATING FOR HIGH TEMPERATURE THERMAL CYCLING APPLICATIONS" each filed on Sep. 13, 2006 and each incorporated herein by reference.

In accordance with embodiments of the invention, the limits for known impurities in order to achieve a desirable sintering rate and therefore increase service lifetime when used as a coating are about:

| | |
|---|---|
| soda (Na$_2$O) | 0.1 weight percent |
| silica (SiO$_2$) | 0.05 weight percent |
| alumina (Al$_2$O$_3$) | 0.01 weight percent |
| titania (TiO$_2$) | 0.05 weight percent |
| hematite (Fe$_2$O$_3$) | 0.05 weight percent |
| calcia (CaO) | 0.05 weight percent, and |
| magnesia (MgO) | 0.05 weight percent. |

In a preferred embodiment, the limits for known impurities are about:

| | |
|---|---|
| Na$_2$O | 0.01 weight percent |
| SiO$_2$ | 0.01 weight percent |
| Al$_2$O$_3$ | 0.01 weight percent |
| TiO$_2$ | 0.01 weight percent |
| Fe$_2$O$_3$ | 0.01 weight percent |
| CaO | 0.025 weight percent, and |
| MgO | 0.025 weight percent. |

The impurity limits in the embodiments above are not indicative that any or all of the impurities listed will be included in the material in any amount. The embodiment of the invention may include zero weight percent of one or more of the above-listed impurities.

Figure 3:
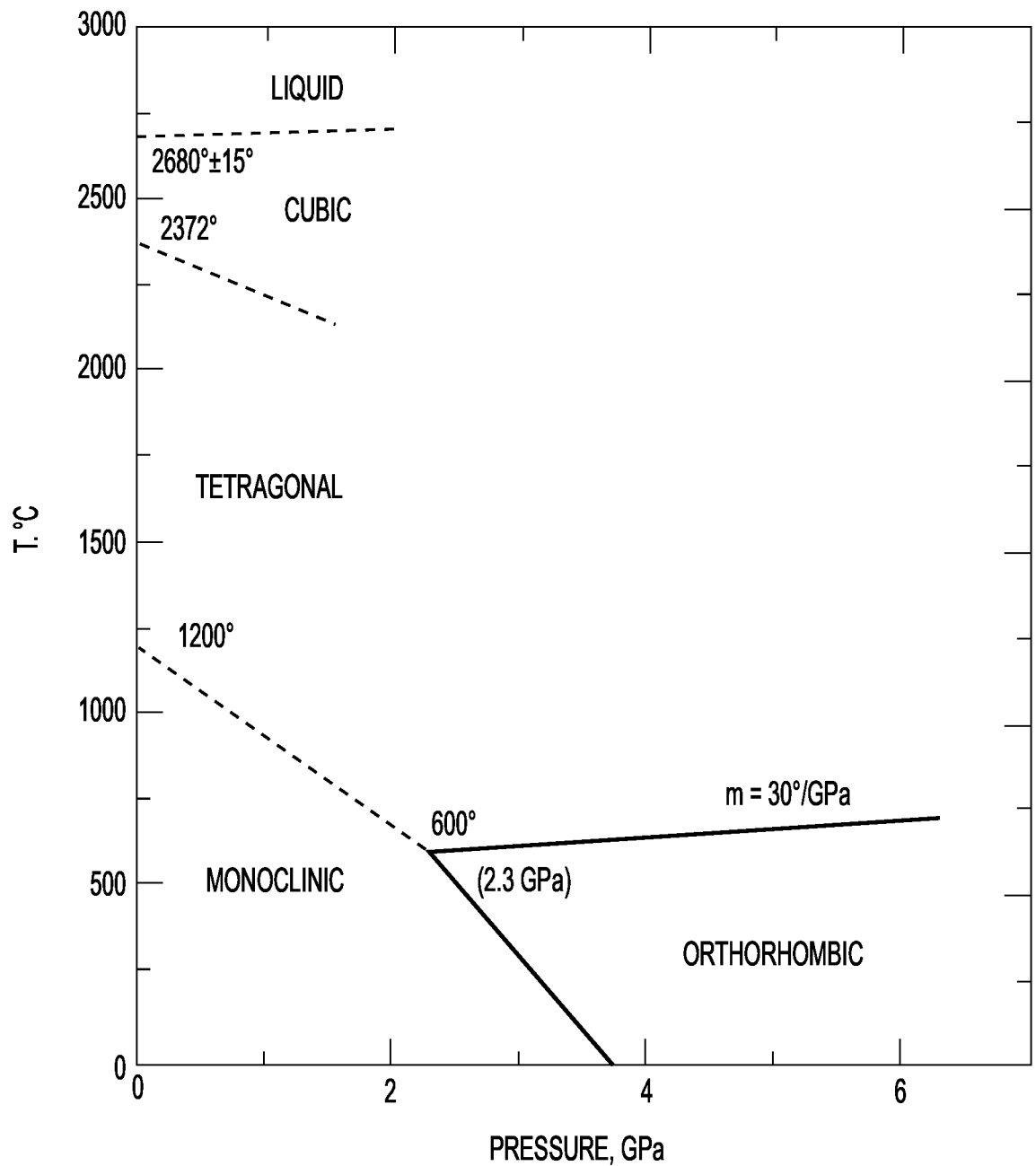
FIG. 3 provides a phase diagram for $ZrO_2$.

FIG. 3 provides a phase diagram for pure zirconia. (The diagram can be found, for example, in Ceramic Phase Diagrams vol. 3, FIG. 04259.) As shown in FIG. 3, pure zirconia exists in three crystal phases at different temperatures. At very high temperatures (>2370.degree. C.) the material has a cubic structure. At intermediate temperatures (1200 to 2372.degree. C.) it has a tetragonal structure. At relatively lower temperatures (below 1200.degree. C.) the material transforms to the monoclinic structure. The transformation from tetragonal to monoclinic is rapid and is accompanied by a 3 to 5 percent volume increase that causes extensive stress in the material. Thus, pure zirconia cannot fulfill the coating requirements for high-temperature cycling. The resulting strain difference between the coating and substrate caused by the phase transformation results in a stress that is greater than the bond strength between them, so the coating will detach.

In accordance with embodiments of the invention, in order to overcome the volume change caused by the undesired phase transformation described above, one or more elements are added to the zirconia to modify the amount of phase transformation that occurs. The stabilizing elements, which are suitable for changing the amount and rate of phase transformation that occurs in the oxide coating, may include the following: scandium, yttrium and the rare earths, particularly the lanthanides, since they have solubility in zirconia. Scandium is not typically used due to its rarity and resulting prohibitive cost. Use of rare earths metals from the actinide group such as uranium and thorium may be limited due to their radioactivity. Thus, yttrium is a preferred stabilizing element.

Figure 4:
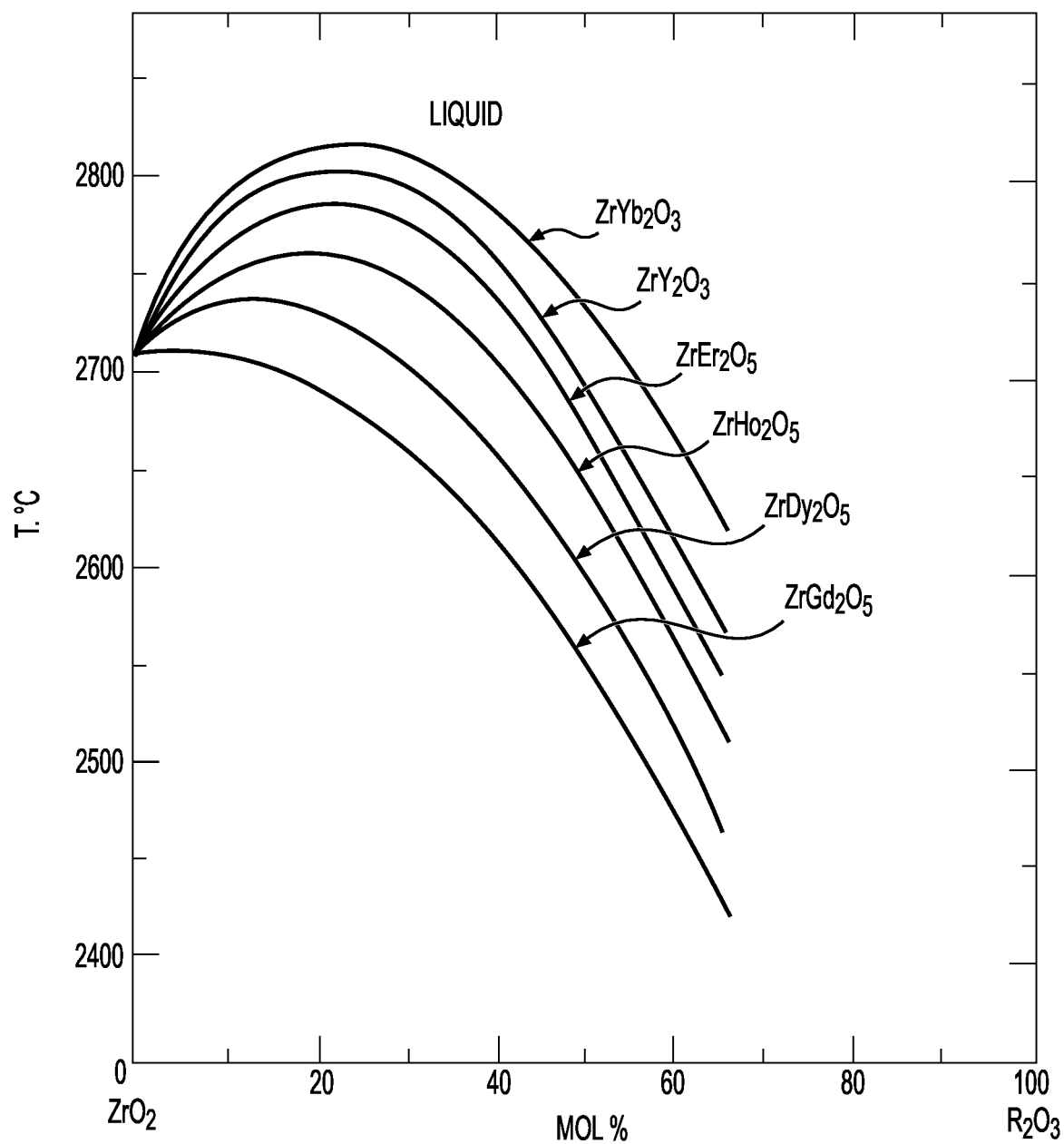
FIG. 4 provides a standard phase diagram for stabilized $ZrO_2$ showing the general alloying trends for various stabilizers [Ceramic Phase Diagram, Volume 4, FIG. 05241]
Figure 5:
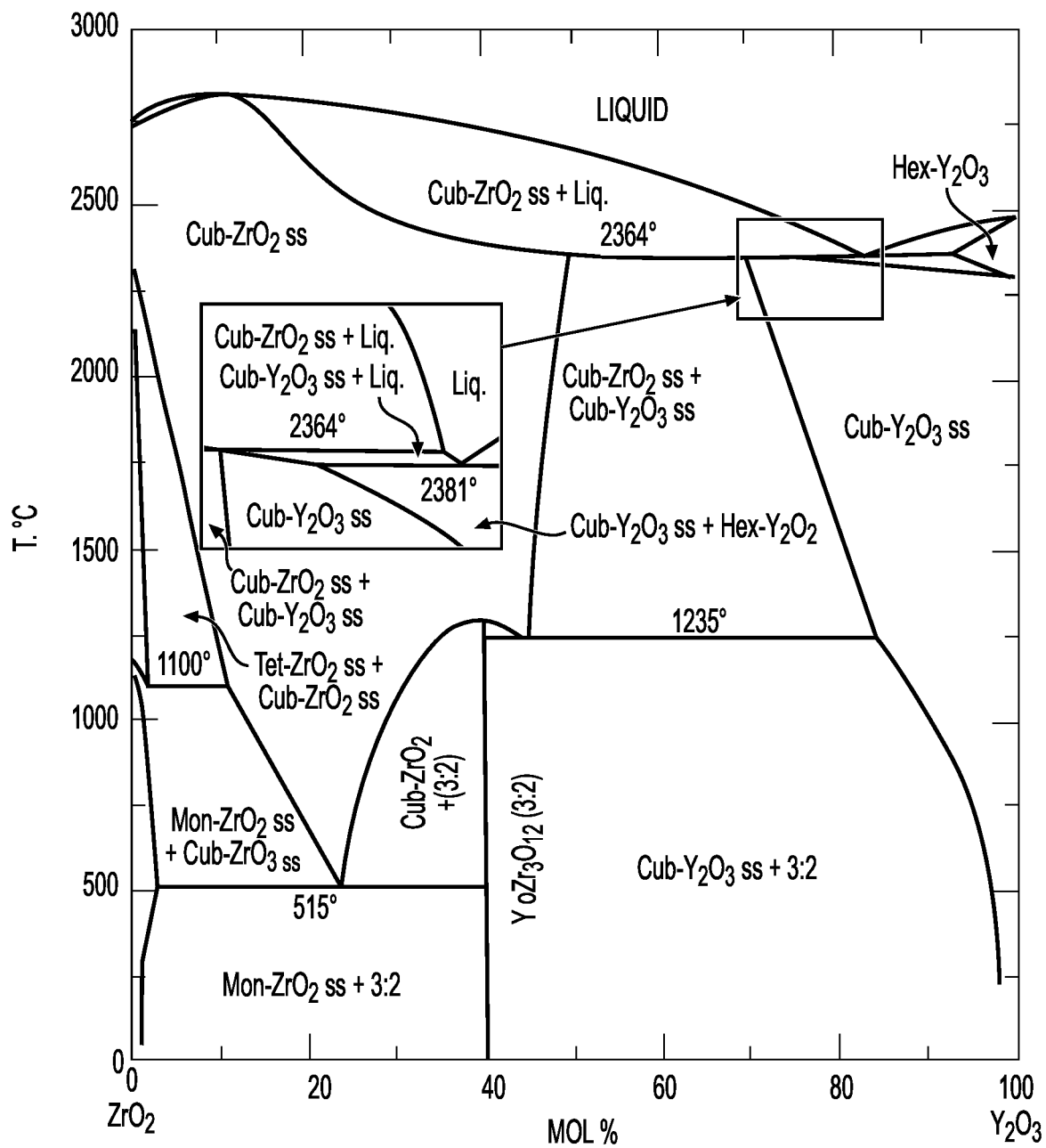
FIG. 5 provides a phase diagram for $ZrO_2$ with stabilizer.

FIG. 4 provides a standard phase diagram for stabilized zirconia showing the general alloying trends for the zirconia stabilizers. A specific diagram for zirconia with yttria as a stabilizer is given in FIG. 5. (The diagram can be found, for example, in Ceramic Phase Diagram, vol. Zirconia, figure Zr-157.)

Phase transformation in partially stabilized zirconia may possibly cause localized stresses that lead to the formation of micron-sized micro-cracks in the coating upon thermal cycling that cancel out some of the massive stress caused by coating volume shrinkage. Thus, these two phenomena of the coating structure-shrinking and cracking—work against each other and finding a balance between them will maximize coating lifetime. This mechanism implies then that the structure of the crack network of the coating is changing with time as the phase of the ceramic material changes. This mechanism is required for a thermal barrier or high temperature abradable coatings to survive thermal cycling.

The addition of a stabilizing element affects two main properties of the zirconia coating system in a positive manner. First, the addition of a stabilizer as illustrated in FIG. 4 generally increases the melting temperature of the zirconia (in the partially stabilized composition ranges). Second, the addition of a stabilizer generally decreases the thermal conductivity. Once the critical composition that has the highest thermal cycling values is found experimentally for a stabilizer, the stabilizers can be compared by the melting point at the critical composition.

Rising fuel cost and other factors continue to drive the need for improved operational efficiency, and thus higher operating temperatures, of gas turbines. While yttria stabilized zirconia is the material of choice for stabilization, greater operational temperatures can be achieved using ytterbia (FIG. 4) for example. Zirconia partially stabilized by ytterbia provides a better composition, since it also has one of the lowest thermal conductivities of the potential stabilizers when alloyed with zirconia. As the need for higher operating temperatures increases, a higher coating material cost may be tolerated, so ytterbia partially stabilized zirconia may become a preferred thermal barrier or high temperature abradable coating system. Given then the trade-offs of cost and performance, a combination of both yttria and ytterbia stabilizers is expected to have optimum performance to cost ratio.

A blend of two or more partially stabilized high-purity material compositions may also be used. For example, in another embodiment, a blended ceramic material for use in high-temperature thermal barriers is provided. The blended materials include a first material with a yttria (Y$_2$O$_3$) stabilizer, and a balance of at least one of zirconia (ZrO$_2$) and hafnia (HfO$_2$) and combinations thereof, wherein the zirconia (ZrO$_2$) and/or hafnia (HfO$_2$) is partially stabilized by the yttria stabilizer, and having total impurities less than or equal to 0.15 weight percent, and preferably less than or equal to 0.1 weight percent. The range of Y$_2$O$_3$ stabilizer is about 4-12 weight percent, and preferably 6-9 weight percent. The second material of the blended material may contain a ytterbia (Yb$_2$O) stabilizer and a balance of at least one of zirconia (ZrO$_2$) and hafnia (HfO$_2$) and combinations thereof, wherein the zirconia (ZrO$_2$) and/or hafnia (HfO$_2$) is partially stabilized by the ytterbia stabilizer, and having total impurities less than or equal to 0.15 weight percent, and preferably less than or equal to 0.1 weight percent. The range of Yb$_2$O$_5$ stabilizer is about 4-16 weight percent, and preferably 10-16 weight percent. In the blended material, the ytterbia (Yb$_2$O$_5$) stabilized zirconia (ZrO$_2$) and/or hafnia (HfO$_2$) fraction may include about 5-50 weight percent of the total and preferably about 15-30 weight percent of the total. The yttria stabilized zirconia (ZrO$_2$) and/or hafnia (HfO$_2$) fraction may include about 50-95 weight percent of the total and preferably about 70-85 weight percent of the total blend.

In another embodiment the blended material includes a first material with a ytterbia (Yb$_2$O$_5$) stabilizer, and a balance of at least one of zirconia (ZrO$_2$) and hafnia (HfO$_2$) and combinations thereof, wherein the zirconia (ZrO$_2$) and/or hafnia (HfO$_2$) is partially stabilized by the ytterbia stabilizer, and having total impurities less than or equal to 0.15 weight percent, and preferably less than or equal to 0.1 weight percent. The range of $Yb_2O_5$ stabilizer is about 4-16 weight percent, and preferably 10-16 weight percent. The second material of the blended material may contain a stabilizer of at least one of neodymium ($Nd_2O_3$), europia ($Eu_2O_5$), and combinations thereof and a balance of at least one of zirconia ($ZrO_2$) and hafnia ($HfO_2$) and combinations thereof, wherein the balance is partially stabilized by the stabilizer, and having total impurities less than or equal to 0.15 weight percent, and preferably less than or equal to 0.1 weight percent. The range of $Nd_2O_3$ stabilizer is about 4-20 weight percent, and preferably 8-16 weight percent. The range of $Eu_2O_3$ stabilizer is about 4-16 weight percent, and preferably 10-16 weight percent. The range of the combined $Nd_2O_3$ and $Nd_2O_3$ stabilizer is about 4-16 weight percent. In the blended material, the ytterbia ($Y_2O_3$) stabilized zirconia ($ZrO_2$) and/or hafnia ($HfO_2$) fraction may include about 5-50 weight percent of the total and preferably about 15-30 weight percent of the total. The yttria stabilized zirconia ($ZrO_2$) and/or hafnia ($HfO_2$) fraction may include about 50-95 weight percent of the total and preferably about 70-85 weight percent of the total blend.

In another embodiment of the invention the blended material includes a first material with a yttria ($Y_2O_3$) stabilizer, and a balance of at least one of zirconia ($ZrO_2$) and hafnia ($HfO_2$) and combinations thereof, wherein the zirconia ($ZrO_2$) and/or hafnia ($HfO_2$) is partially stabilized by the yttria stabilizer, and having total impurities less than or equal to 0.15 weight percent, and preferably less than or equal to 0.1 weight percent. The range of $Y_2O_3$ stabilizer is about 4-12 weight percent, and preferably 6-9 weight percent. The second material of the blended material may contain a stabilizer of at least one of neodymium ($Nd_2O_3$), europia ($Eu_2O_5$), and combinations thereof and a balance of at least one of zirconia ($ZrO_2$) and hafnia ($HfO_2$) and combinations thereof, wherein the balance is partially stabilized by the stabilizer, and having total impurities less than or equal to 0.15 weight percent, and preferably less than or equal to 0.1 weight percent. The range of $Nd_2O_3$ stabilizer is about 4-20 weight percent, and preferably 8-16 weight percent. The range of $Eu_2O_3$ stabilizer is about 4-16 weight percent, and preferably 10-16 weight percent. The range of the combined $Nd_2O_3$ and $Eu_2O_3$ stabilizer is about 4-16 weight percent. In the blended material, the neodymium ($Nd_2O_3$) and/or europia ($Eu_2O_5$) stabilized zirconia ($ZrO_2$) and/or hafnia ($HfO_2$) fraction may include about 5-50 weight percent of the total and preferably about 15-30 weight percent of the total. The yttria stabilized zirconia ($ZrO_2$) and/or hafnia ($HfO_2$) fraction may include about 50-95 weight percent of the total and preferably about 70-85 weight percent of the total blend.

In a further embodiment of the invention the blended material includes a blend of at least three materials. The first material may contain a yttria ($Y_2O_3$) stabilizer, and a balance of at least one of zirconia ($ZrO_2$) and hafnia ($HfO_2$) and combinations thereof, wherein the zirconia ($ZrO_2$) and/or hafnia ($HfO_2$) is partially stabilized by the yttria stabilizer, and having total impurities less than or equal to 0.15 weight percent, and preferably less than or equal to 0.1 weight percent. The range of $Y_2O_3$ stabilizer is about 4-12 weight percent, and preferably 6-9 weight percent. The second material of the blend may contain a ytterbia ($Yb_2O_5$) stabilizer, and a balance of at least one of zirconia ($ZrO_2$) and hafnia ($HfO_2$) and combinations thereof, wherein the zirconia ($ZrO_2$) and/or hafnia ($HfO_2$) is partially stabilized by the ytterbia stabilizer, and having total impurities less than or equal to 0.15 weight percent, and preferably less than or equal to 0.1 weight percent. The range of $Yb_2O_0$ stabilizer is about 4-16 weight percent, and preferably 10-16 weight percent. The third material of the blend may contain a stabilizer of at least one of neodymium ($Nd_2O_3$), europia ($Eu_2O_5$), and combinations thereof and a balance of at least one of zirconia ($ZrO_2$) and hafnia ($HfO_2$) and combinations thereof, wherein the balance is partially stabilized by the stabilizer, and having total impurities less than or equal to 0.15 weight percent, and preferably less than or equal to 0.1 weight percent. The range of $Nd_2O_3$ stabilizer is about 4-20 weight percent, and preferably 8-16 weight percent. The range of $Eu_2O_3$ stabilizer is about 4-16 weight percent, and preferably 10-16 weight percent. The range of the combined $Nd_2O_3$ and $Eu_2O_3$ stabilizer is about 4-16 weight percent. In the blended material, the ytterbia ($Y_2O_3$) stabilized zirconia ($ZrO_2$) and/or hafnia ($HfO_2$) fraction may include about 5-45 weight percent of the total, and preferably about 15-30 weight percent of the total. The neodymium ($Nd_2O_3$) and/or europia ($Eu_2O_5$) stabilized zirconia ($ZrO_2$) and/or hafnia ($HfO_2$) fraction may also include about 5-45 weight percent of the total and preferably about 15-30 weight percent of the total. The yttria stabilized zirconia ($ZrO_2$) and/or hafnia ($HfO_2$) fraction may include about 10-90 weight percent of the total, and preferably about 30-60 weight percent of the total blend.

Material of embodiments of the present invention can be provided in a variety of forms for use in thermal spray applications. For example, the material is supplied in the form of a powder, a slurry of powder, or a chemical solution of the constituents. If in powder form, the powder may be in the form of a spray dried powder of the individual constituents and organic binder, spray dried powder of the combined individual constituents and organic binder, fused and crushed powder, agglomerated and sintered powder, plasma densified material or powder from chemical solution routes. Typical particle sizes for the powders may vary but typically range between about 5-150 microns when deposited by various thermal spray equipment, preferably ranging between about 15-125 microns for air plasma spray and ranging between about 5-30 microns for low pressure plasma spray.

Typically for thermal spray applications, a polymer or organic material in powder form can be added to the material blend. Powder may be in the form of a spray dried powder of the individual constituents and an organic binder, spray dried powder of the combined individual constituents and an organic binder, fused and crushed powder, agglomerated and sintered powder, plasma densified material or powder from chemical solution routes. The organic binder may be used to at least partially bond together the placeholder material and the ceramic material. For high temperature abradable coatings, the benefit of adding a fugitive phase is that a higher porosity than is achievable with conventional deposition methods. The increased porosity aids abradability by introducing more surfaces to the crack network of the coating, decreasing the coating elastic modulus and thus promoting controlled material removal. Thus, according to an embodiment of the invention, a coating material may have about 70 to 99 weight percent of an ultra-pure ceramic material as previously described and about 1-30 weight percent (and preferably 2-15 weight percent) of a placeholder material. The placeholder material may be an organic powder material or an inorganic powder material that can be burned out subsequent to deposition of the coating material.

Porosities and cracks provide strain tolerance to TBCs and help to reduce thermal conductivities. Using thermal spray process, such as air plasma spray, flame spray or low pressure plasma spray, a high purity coating structure 120

Figure 6:
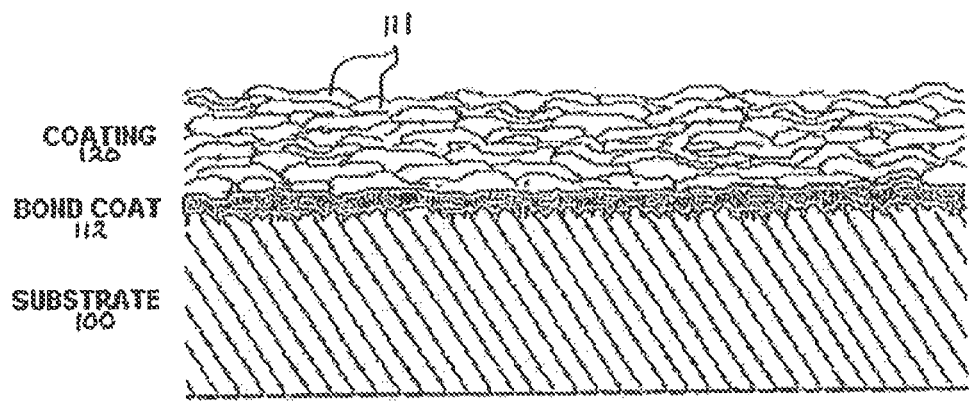
FIG. 6 provides a diagram showing a lamellar thermal barrier coating structure containing porosity and microcracks.

(shown in FIG. 6) that comprise a ceramic matrix, porosity and microcracks can be achieved. The high purity coating structure is formed by injecting particles of invention high purity materials into a high temperature and high velocity flame. These particles are then heated and accelerated in the flame. Before reaching the substrate, some particles are molten, while some other particles are semi-molten or not melted. Referring to FIG. 6, molten and semi-molten particles strike on the substrate 100 (or optional bond coat 112) and then spread and solidify rapidly to form disk-like deposits 111, which are referred to as splats. Although some unmelted particles are entrapped and incorporated into the coating, most of them bounce off when they hit the substrate. The accumulation of splats and small amount of unmelted particles results in the coating formation. Due to shrinkage occurred during rapid solidification and imperfect packing of splats and unmelted particles, voids and cracks are generated in the coating. Herein, porosity refers to a void with an aspect ratio (length divided by width) of less than about 10. Typical porosity is in the range of about 5.about.20 volume percent, preferably in the range of about 7.about.15 volume percent. Micro cracks refers to a void with an aspect ratio (length divided by width) of larger than about 10 and the length of the void is less than about 100 micrometers. Typical volume percentage of micro cracks is in the range of about 2.about.15 volume percent, preferably in the range of about 5.about.10 volume percent.

Figure 7:
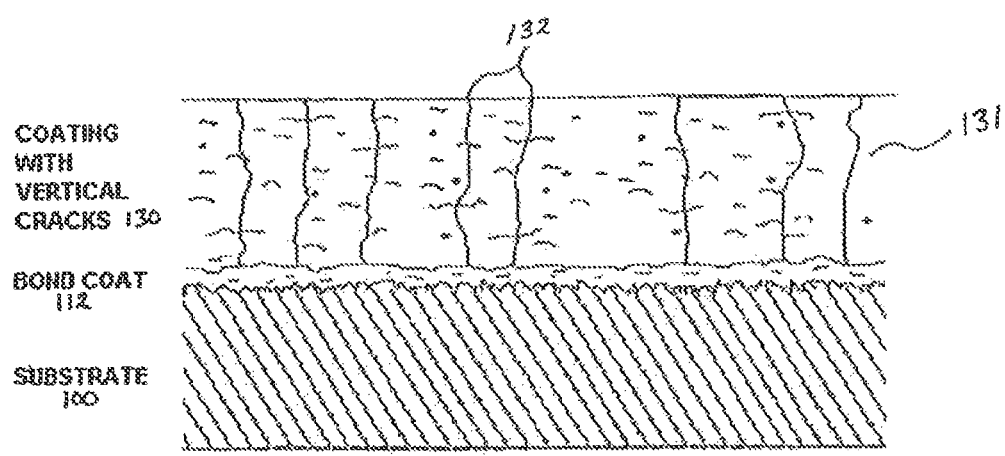
FIG. 7 provides a diagram showing a thermal barrier coating containing porosity, microcracks and macrocracks.

In order to enhance the strain tolerance of the aforementioned high purity TBCs, macro cracks that runs normal to the top coat and substrate interface can be introduced into the coating. As a result, another high purity coating structure that comprise a ceramic matrix, porosity, macro cracks and micro cracks (FIG. 7) can be achieved by thermal spray processes, such as air plasma spray, flame spray or low pressure plasma spray. The high purity coating structure 130 of FIG. 7 is formed by injecting particles of inventive materials into a high temperature and high velocity flame. These particles are then heated and accelerated in the flame. Before reaching the substrate, some particles are molten, while some other particles are semi-molten or not melted. Molten and semi-molten particles strike on the substrate 100 (or optional bond coat 112) and then spread and solidify rapidly to form disk-like deposits, which is referred to as splats. Although some unmelted particles are entrapped and incorporated into the coating, most of them bounce off when they hit the substrate. The accumulation of splats 131 and small amount of unmelted particles results in the coating formation 130. Due to shrinkage occurred during rapid solidification and imperfect packing of splats and unmelted particles, voids and cracks are generated in the coating. When coating deposition conditions are controlled to generate large shrinkage stress and improve the packing of splats to reduce voids and gaps between splats, cracks 132 normal to the coating 130 and substrate 100 interface are created. Herein, macro cracks refers to a void with an aspect ratio (length divided by width) of larger than about 10 and the length of the void is longer than about 100 micrometers. More than about 90% of the macro cracks are arranged in the direction normal to the top coat and substrate interface. These macro cracks are referred to as vertical macro cracks, while the macro cracks parallel to the top coat and substrate interface are referred to as horizontal vertical cracks. For this coating structure, typical volume percentage of porosity and micro cracks is less than about 10% and 5%, preferably less than about 5% and 3%, respectively. The average number of vertical macro cracks in a length of 25.4 mm along the top coat and substrate interface is in the range of about 5 to 250, preferably in the range of about 50 to 150.

Figure 8:
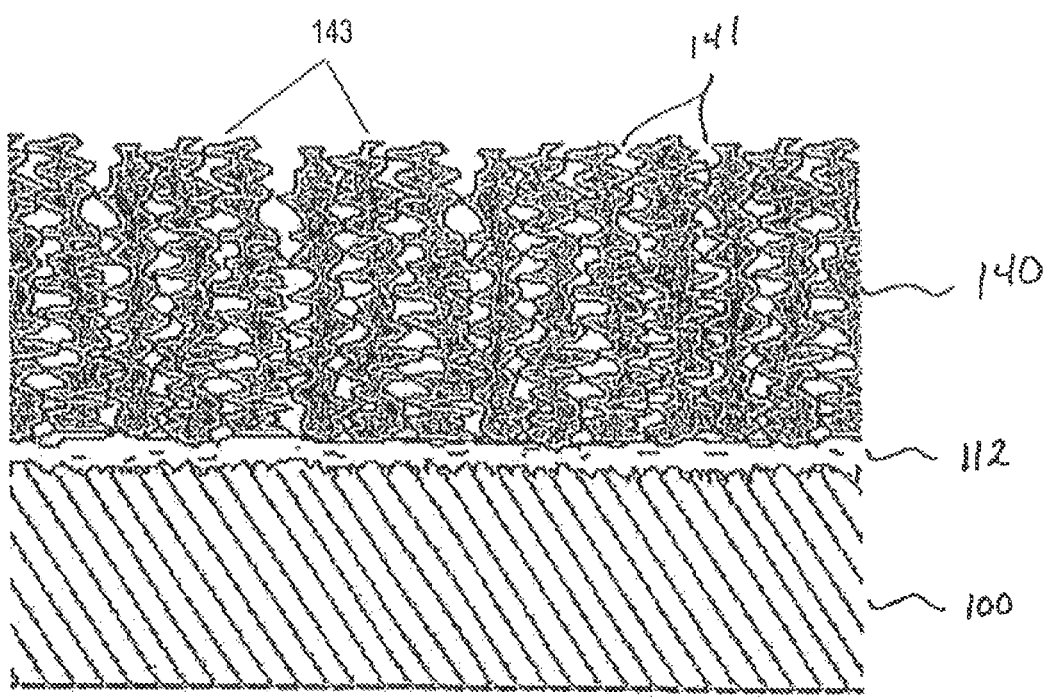
FIG. 8 provides a diagram showing a thermal barrier coating deposited from the vapor phase.

When coatings are produced using a vapor deposition process, such as electron beam assisted physical vapor deposition process (EB-PVD) or low pressure (lower than ambient) plasma spraying, the resulting coating has a unique columnar structure. The gaps between columns impart excellent strain tolerance to the coating. Accordingly, TBCs produce using vapor deposition process, such as EB-PVD or low pressure (lower than ambient) plasma spraying, usually have a higher durability than TBCs produced using thermal spray processes. As illustrated in FIG. 8, if vapor deposition process was employed, another high purity coating structure 140 that comprises ceramic columns 143 and gaps 141 between them can be achieved. An optional bond coat 112 is shown between the substrate 100 and the coating 140. The high purity coating structure 140 is formed by vaporizing the inventive high purity materials in a form of powder, ingot, target, solution or suspension. The formed vapor then deposited atomically on the substrate. By controlling processing temperature and pressure according to the Thornton's model (FIG. 9), a coating with columnar structure is formed. Herein, ceramic columns 143 are basically a cluster of crystals. More than about 90% of the crystals are at an angle of about 45 to 135 degree to the top coat and substrate interface. Within the cluster of crystals, voids smaller than about 20 micrometers are present. The gaps 141 between the columns have an aspect ratio (length divided by width) of larger than about 10. More than about 90% of the gaps are at an angle of about 45 to 135 degree to the top coat and substrate interface.

Figure 9:
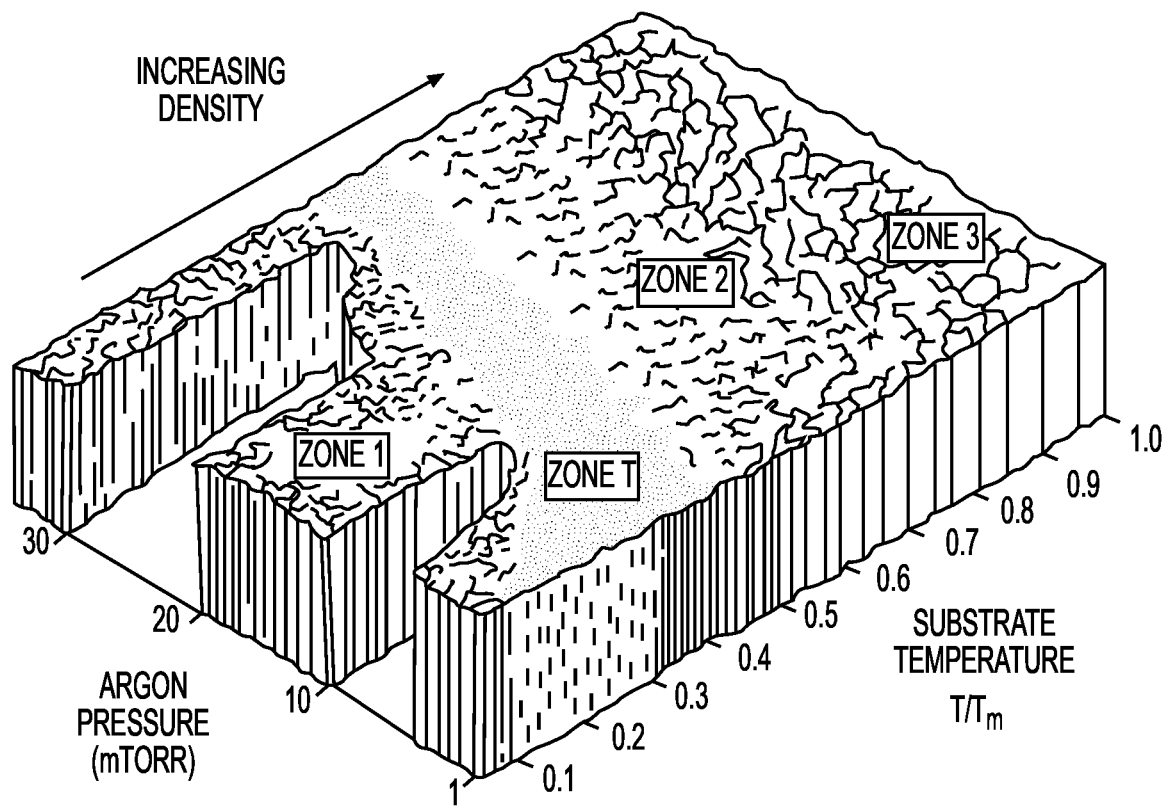
FIG. 9 provides a diagram showing the Thornton model for predicting structure of a coating formed from the gas phase.
Figure 10:
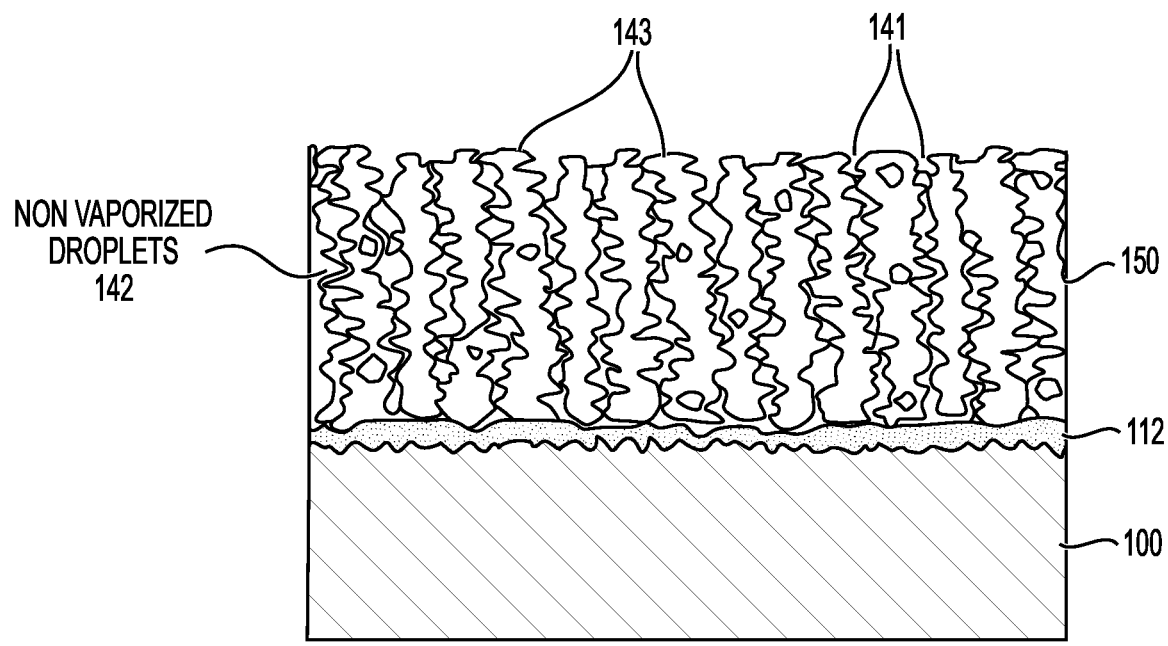
FIG. 10 provides a diagram showing a thermal barrier coating deposited from both vapor and liquid phase.

In low pressure (lower than ambient) plasma spraying process, if molten droplets are also generated during the vaporization of the invention high purity materials, then the entrapment and incorporation of these droplets into the coating results in the formation of another high purity coating structure. As illustrated in FIG. 9, the high purity coating structure 150 comprises ceramic columns 143, gaps between the columns 141, and nodules 142 distributing randomly in the gaps and columns. An optional bond coat 112 is shown between the substrate 100 and the coating 150. Herein, ceramic columns 143 are basically a cluster of crystals. More than 90% of the crystals are oriented at an angle of 45 to 135 degree to the top coat and substrate interface. Within the cluster of crystals 143, voids smaller than 20 micrometers are present. The gaps 141 between the columns have an aspect ratio (length divided by width) of larger than about 10. More than 90% of the gaps 141 are oriented at an angle of 45 to 135 degree to the top coat and substrate interface. The nodules 142 distributing randomly in the gaps and columns are frozen droplets. The size of these nodules 142 is typically less than about 45 micrometers, preferably less than about 30 micrometers.

While exemplary embodiments of the invention have been shown and described herein, it will be obvious to those skilled in the art that such embodiments are provided by way of example only. Numerous insubstantial variations, changes, and substitutions will now be apparent to those skilled in the art without departing from the scope of the invention disclosed herein by the Applicants. Accordingly, it is intended that the invention be limited only by the spirit and scope of the claims, as they will be allowed.

What is claimed:

1. A high purity yttria or ytterbia stabilized zirconia powder having a purity of at least 99.5 weight percent purity and a maximum amount of oxide impurities is as follows:

less than 0.005 weight percent $SiO_2$;
less than 0.015 weight percent $Al_2O_3$;
less than 0.002 weight percent $TiO_2$; and
less than 0.002 weight percent MgO.

2. The powder of claim 1, wherein the maximum amount of oxide impurities is further as follows:
less than 0.04 weight percent $Fe_2O_3$;
less than 0.02 weight percent CaO; and
less than 0.001 weight percent $Cr_2O_3$; and
less than 0.002 weight percent $Na_2O$.

3. The powder of claim 1, wherein the powder is a thermal sprayable powder.

4. The powder of claim 1, wherein the zirconia is partially stabilized by the yttria.

5. The powder of claim 1, wherein said powder has a particle size of from about 5 to 150 microns.

6. A method of applying a thermal barrier coating on a substrate, the method comprising:
thermally spraying the powder of claim 1 onto the substrate so as to form the thermal barrier coating having from about 5 to 250 vertical macro cracks per 25.4 mm length measured along a coating surface and being oriented perpendicular to a surface of the substrate containing said coating.

7. A high purity yttria or ytterbia stabilized hafnia powder having a purity of at least 99.5 weight percent purity and a maximum amount of oxide impurities is as follows:
less than 0.002 weight percent $Na_2O$;
less than 0.005 weight percent $SiO_2$;
less than 0.015 weight percent $Al_2O_3$;
less than 0.002 weight percent $TiO_2$;
less than 0.04 weight percent $Fe_2O_3$;
less than 0.02 weight percent CaO;
less than 0.002 weight percent MgO; and
less than 0.001 weight percent $Cr_2O_3$.

8. The powder of claim 7, wherein the powder is a thermal sprayable powder.

9. The powder of claim 7, wherein the hafnia is partially stabilized by the yttria.

10. The powder of claim 7, wherein said powder has a particle size of from about 5 to 150 microns.

11. A method of applying a thermal barrier coating on a substrate, the method comprising:
thermally spraying the powder of claim 7 onto the substrate so as to form the thermal barrier coating having from about 5 to 250 vertical macro cracks per 25.4 mm length measured along a coating surface and being oriented perpendicular to a surface of the substrate containing said coating.

12. A high purity yttria stabilized zirconia powder comprising:
a purity of at least 99.5 weight percent purity, less than about 0.005 weight percent silicon dioxide (silica), less than about 0.015 weight percent aluminum oxide (alumina), less than about 0.02 weight percent calcium oxide, less than about 0.04 weight percent ferric oxide, less than about 0.002 weight percent magnesium oxide, and less than about 0.002 weight percent titanium dioxide.

13. The powder of claim 12, wherein the powder is a thermal sprayable powder.

14. The powder of claim 12, wherein the zirconia is partially stabilized by the yttria.

15. The powder of claim 12, wherein said powder has a particle size of from about 5 to 150 microns.

16. A method of applying a thermal barrier coating on a substrate, the method comprising:
thermally spraying the powder of claim 12 onto the substrate so as to form the thermal barrier coating having from about 5 to 250 vertical macro cracks per 25.4 mm length measured along a coating surface and being oriented perpendicular to a surface of the substrate containing said coating.

17. A method of coating a substrate with a thermal barrier coating (TBC) on a substrate via thermal spray, the method comprising:
spraying a powder coating material comprising a yttria stabilized material comprising zirconia and hafnia and a purity of at least 99.5 weight percent and total impurities of said powder coating material comprises less than or equal to: about 0.005 weight percent silica, about 0.002 weight percent titania, and about 0.002 weight percent magnesia; and
forming a TBC coating by depositing the coating material in the form of a collection of frozen droplets or splats, wherein the TBC coating comprises vertical cracks arranged at repeating intervals and extending in a thickness direction of said thermal barrier coating.

18. A high purity yttria stabilized zirconia and/or hafnia coating material with a purity of at least 99.5 weight percent purity and a maximum amount of oxide impurities is as follows:
less than 0.005 weight percent $SiO_2$;
less than 0.015 weight percent $Al_2O_3$;
less than 0.002 weight percent $TiO_2$; and
less than 0.002 weight percent MgO.

19. The coating material of claim 18, wherein the coating material is a powder.

20. The coating material of claim 19, wherein the maximum amount of oxide impurities also includes:
less than 0.04 weight percent $Fe_2O_3$; and
less than 0.02 weight percent CaO.

* * * * *